United States Patent [19]

Rossi

[11] Patent Number: 5,619,018

[45] Date of Patent: Apr. 8, 1997

[54] LOW WEIGHT MULTILAYER PRINTED CIRCUIT BOARD

[75] Inventor: Markku J. Rossi, Houston, Tex.

[73] Assignee: Compaq Computer Corporation, Houston, Tex.

[21] Appl. No.: 415,413

[22] Filed: Apr. 3, 1995

[51] Int. Cl.$^6$ .................................................. H05K 1/02
[52] U.S. Cl. ........................ 174/261; 174/262; 361/791; 439/82
[58] Field of Search ................................ 174/261, 262, 174/266, 257; 361/795, 791; 439/82, 46, 45

[56] References Cited

U.S. PATENT DOCUMENTS

| | | | |
|---|---|---|---|
| 2,795,770 | 6/1957 | Toedtman | 339/278 |
| 2,872,391 | 2/1959 | Hauser et al. | 204/15 |
| 2,969,517 | 1/1961 | Gluck | 339/17 |
| 3,305,416 | 2/1967 | Kahan et al. | 156/3 |
| 3,312,870 | 4/1967 | Rhoades | 317/99 |
| 3,317,652 | 5/1967 | Johannessen et al. | 174/68.5 |
| 3,446,908 | 5/1969 | Tally et al. | 174/68.5 |
| 3,516,156 | 6/1970 | Steranko | 29/627 |
| 3,519,959 | 7/1970 | Bewley et al. | 333/6 |
| 3,524,960 | 8/1970 | Lohff | 200/155 |
| 3,781,596 | 12/1973 | Galli et al. | 317/101 F |
| 3,821,692 | 6/1974 | Barnard | 339/97 |
| 3,827,004 | 7/1974 | Vanden Heuvel et al. | 339/221 R |
| 3,829,601 | 8/1974 | Jeannotte et al. | 174/68.5 |
| 3,875,479 | 4/1975 | Jaggar | 317/101 CM |
| 3,880,486 | 4/1975 | Avakian | 339/17 M |
| 3,927,841 | 12/1975 | Iacobucci | 339/278 C |
| 4,181,396 | 1/1980 | Olashaw | 339/263 R |
| 4,562,301 | 12/1985 | Kameda et al. | 174/68.5 |
| 4,591,220 | 5/1986 | Impey | 339/17 M |
| 4,591,659 | 5/1986 | Leibowitz | 174/68.5 |
| 4,610,756 | 9/1986 | Strobel | 156/645 |
| 4,633,035 | 12/1986 | McMonagle | 174/68.5 |
| 4,663,208 | 5/1987 | Ninomiya et al. | 428/138 |
| 4,679,122 | 7/1987 | Belke, Jr. et al. | 361/414 |
| 4,681,655 | 7/1987 | Potter | 156/632 |
| 4,691,078 | 9/1987 | Nishioka et al. | 174/68.5 |
| 4,691,971 | 9/1987 | Hahn | 439/78 |
| 4,755,911 | 7/1988 | Suzuki | 361/414 |
| 4,784,707 | 11/1988 | Wefers et al. | 156/48 |
| 4,786,523 | 11/1988 | Dohya | 427/96 |
| 4,830,691 | 5/1989 | Kida et al. | 156/631 |
| 4,906,198 | 3/1990 | Cosimano et al. | 439/82 |
| 5,015,207 | 5/1991 | Koepke | 439/886 |
| 5,072,075 | 12/1991 | Lee et al. | 174/264 |
| 5,097,390 | 3/1992 | Gerrie et al. | 361/412 |
| 5,129,142 | 7/1992 | Bindra et al. | 29/852 |
| 5,130,882 | 7/1992 | Hilland | 361/56 |
| 5,183,404 | 2/1993 | Aldous et al. | 439/55 |
| 5,217,478 | 6/1993 | Rexroth | 606/180 |
| 5,224,017 | 6/1993 | Martin | 361/388 |
| 5,236,772 | 8/1993 | Horikoshi et al. | 428/209 |
| 5,281,771 | 1/1994 | Swift et al. | 174/262 |
| 5,301,420 | 4/1994 | Cho et al. | 29/840 |
| 5,348,792 | 9/1994 | Hattori et al. | 428/209 |
| 5,362,359 | 11/1994 | Horikoshi et al. | 156/645 |
| 5,372,872 | 12/1994 | Funada et al. | 428/210 |
| 5,487,684 | 1/1996 | Sohalk et al. | 439/715 |

*Primary Examiner*—Laura Thomas
*Attorney, Agent, or Firm*—Markku Rossi

[57] ABSTRACT

A multilayer printed circuit board comprising conducting layers of a first material and conducting layers of a second material includes noncorrosive low resistance electrical contacts between conducting layers of the first and second material. The noncorrosive low resistance contacts allow the use of light weight conducting materials for particular layers of the circuit board to produce a light weight multilayer circuit board.

40 Claims, 3 Drawing Sheets

LOW WEIGHT MULTILAYER PRINTED CIRCUIT BOARD

BACKGROUND OF THE INVENTION

1. Technical Field of the Invention

The present invention relates to circuit boards, and more particularly to a multilayer printed circuit board which includes conducting layers of lightweight material.

2. Description of the Prior Art

Recent progress in electronics technology has resulted in electronic circuits capable of performing increasingly sophisticated functions. A large number of these electronic circuits can now be implemented on a single chip to form a single compact integrated circuit. The use of integrated circuits has allowed the design and manufacture of sophisticated electronic products of, smaller size, and increasingly lighter weight. In order to design and manufacture these sophisticated electronic products, it is necessary that many integrated circuits be mounted and electrically interconnected in a single compact package using some type of high density packaging. Because the input/output pin count of integrated circuit devices has increased correspondingly with the sophistication of the functions contained on the chip, the high density packaging arrangement must also allow the electrical interconnection between a large number of pins from many integrated circuits. Multilayer printed circuit boards are typically used for this high density packaging.

Multilayer printed circuit boards are made up of a number of conducting layers or laminae of printed circuitry between which are placed insulating layers or laminae. The conducting layers are formed of a predetermined pattern, in which portions of the conducting material have been removed. Various methods are known in the art for fabricating multilayer circuit boards. In one common method, the predetermined patterns are formed by etching away conducting material from a conducting layer, after conducting material has been deposited on an insulating layer to form a layer of the board. The layers of the multilayer printed circuit board, each of which has been prepared in this way, are attached to each other by lamination, adhesive such as acrylic adhesive, or other appropriate means. A conducting layer is placed as the outer conducting layer on at least one surface—and typically both surfaces—of the board. The remaining conducting layers form the inner conducting layers of the board. Electrical components, including integrated circuits, are mounted on the side, or, sides of the multilayer printed circuit board which contain an outer conducting layer. The input/output pins of these integrated circuits and components are directly connected to the outer conducting layer of the surface on which they are mounted. Electrical connections between pins of the components mounted on the multilayer printed circuit board's surface are made through the predetermined patterns of the various conducting layers. When it is necessary to connect two different conducting layers to form a desired connection, the connections are done via holes drilled through the insulating and conducting layers. These holes are plated on their inner surface with metalization to form connection towers that provide a electrical connection between certain conducting layers.

A typical multilayer printed circuit board includes six conducting layers of Cu, approximately 0.025 mm thick, each separated from the other by an insulating layer of a material, such as a 0.10–0.29 mm thick layer of FR4. The metalization plating on the holes forming the connection tower that connects the conducting layers is also Cu. The Cu-Cu same material contacts provide non-corrosive, low resistance contacts within the multilayer printed circuit board. Also, the Cu conducting layer on the surface of the multilayer printed circuit board allows low resistance contacts to be made to devices external to the board.

When used in a low weight portable device, such as a portable computer or personal digital assistant(PDA), the surface area necessary for component mounting on a multilayer printed circuit board ranges, for example, from 967 $cm^2$ to 1290 $cm^2$. Since two sides of the board are normally used to mount components, a multilayer printed circuit board of from 483 $cm^2$ to 645 $cm^2$ normally required. The weight of a multilayer printed circuit board of this size could be large compared to the total weight of the portable device. Using 561 $cm^2$ as a typical one-sided surface area of a double-sided circuit board, the weight of a representative multilayer printed circuit board can be calculated. The specific gravity of Cu is 8.900 $g/cm^3$. The specific gravity of FR4 is 2.100 $g/cm^3$. The six Cu layers weigh 6×(561 $cm^2$×0.0025 cmx (8.900 $g/cm^3$)) for 74.894 g. The five FR4 layers weigh 5×(561 $cm^2$×0.010 cmx (2.100 $g/cm^3$)) or 58.905 g. Ignoring the weight of the connection towers, the weight of the multilayer printed circuit board is 133.799 g. or approximately 4.7 ounces. In a portable electronic device such as a 28 ounce PDA, 4.7 ounces is a significant percentage of the total weight.

The use of lighter weight conducting materials in place of the Cu conducting layers of the multilayer printed circuit board can reduce the weight of the board. However, in order to provide noncorrosive low resistance contacts to the components on the surface of the board it is desirable to use Cu for the surface conducting layer. The use of Cu solely for the surface conducting layers, in a multilayer printed circuit board in which lighter weight conducting materials, such as Al are substituted for the inner conducting layers, creates a problem in that noncorrosive low resistance electrical contacts are difficult to make between the outer and inner conducting layers. For example, Cu has an electrochemical potential of 0.34 V, and Al has an electrochemical potential of −1.66 V. A contact between Cu and Al that is exposed to the atmosphere when moisture is present is subject to corrosion when electric current passes through the contact. The exposure of Al to oxygen creates resistive aluminum oxide. As the corrosion builds up the resistance of the contact to current flow also increases.

The present method of using plated holes or bores for interconnecting conducting layers only provides a direct exposed contact between the plating material and conducting layer material. A direct contact of Cu plating material to a lighter weight material such as Al, which is exposed to the atmosphere does not provide the type of low resistance noncorrosive contact necessary for multilayer printed circuit boards.

It would provide an advantage to have a multilayer printed circuit board comprising conducting layers of different weight material, with low resistance noncorrosive electrical contacts between the conducting layers. This would allow lighter weight material to be used to replace heavier weight material, in appropriate conducting layers, to form a low weight multilayer printed circuit board. This low weight multilayer circuit board could be used in lightweight portable devices.

SUMMARY OF THE INVENTION

The present invention is a multilayer printed circuit board that provides a weight advantage over existing multilayer circuit boards. The weight advantage is provided by the use of light weight conducting material in conducting layers of the multilayer printed circuit board. The problem of corrosion on electrical contacts between material having different electrochemical potentials is solved by providing a hermetically sealed contact area where the materials make contact.

In one aspect, the invention provides a multilayer printed circuit board with one or more conducting layers comprising a first material and one or more conducting layers comprising a second material. The conducting layers are bonded to, and are separated from one another by, insulating layers. A structure for interconnecting conducting layers of the first material with conducting layers of the second material includes contact points of the first and second material. The contact points of the first material and the contact points of the second material are used to form electrical contacts with the conducting layers of the first and second materials respectively.

In a second aspect of the invention, the structure for interconnecting conducting layers of the first material with conducting layers of the second material includes a hermetic seal at the point where an electrical connection is formed and current flows between the contact points of the first material and the contact points of the second material.

In a further aspect of the invention, the conducting layers comprising a first material include the outer conducting layers, and the conducting layers comprising a second material include the inner conducting layers of the multilayer printed circuit board.

BRIEF DESCRIPTION OF THE DRAWINGS

Further aspects, advantages, and novel features of the present invention will become apparent from the following detailed description of the invention when considered in conjunction with the accompanying drawings in which.

DETAILED DESCRIPTION OF THE INVENTION

Figure 1:
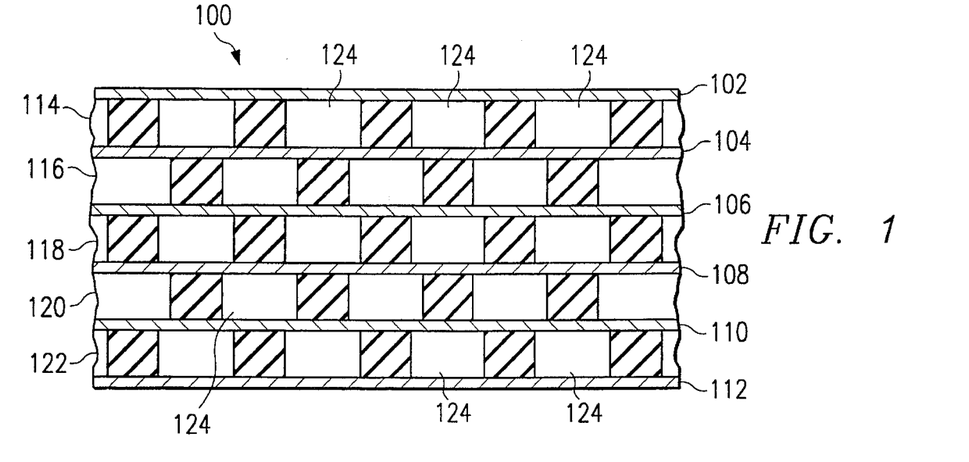
FIG. 1 is an enlarged vertical sectional view of a light weight multilayer printed circuit board formed according to the teachings of the present invention.

Referring now to the drawings, wherein like or similar elements are generally designated with identical reference numerals throughout the several views, and wherein the various elements depicted are not necessarily drawn to scale, there are shown lightweight multilayer printed circuit boards according to the teachings of the present invention. FIG. 1, in particular, depicts a vertical sectional view of a light-weight multilayer printed circuit board 100 formed according to an embodiment of the present invention. In FIG. 1 the multilayer printed circuit board 100 comprises Cu outer conducting layers, 102 and 112, Al inner conducting layers, 104, 106, 108, and 110, and insulating material layers, 114, 116, 118, 120, and 122. Combinations of these and other suitable conducting materials, such as for example, zinc, iron or magnesium may also be used for the conducting layers. The inner conducting layers, 104, 106, 108, and 110 and outer conducting layers, 102 and 112, have a thickness of approximately 0.025 mm. The insulating layers 114, 116, 118, 120, and 122, may be made of insulating material such as Bakelite, epoxy resin, glass fiber reinforced resin or FR4 and have a thickness from 0.10 mm to 0.29 mm. Numerous holes 124 may be drilled, stamped, or otherwise formed in the insulating layers 114, 116, 118, 120, and 122. Web, comblike, or performed insulating layers may be formed. In FIG. 1, the holes 124 are arranged in straight line rows on the surface of the insulating layers 114, 116, 118, 120 and 122. The sectional view in FIG. 1 is taken along a vertical plane which bisects the holes 124 along a straight line row. By including holes 124 in the insulating layers 114, 116, 118, 120, which holes could drill away, for example, 50% of the surface area of the layers, the overall weight of a multilayer printed circuit board according to the teachings of the present invention can be significantly reduced.

The multilayer printed circuit board shown in FIG. 1 can be fabricated by a conventional process. One possible method would be to form layers of the multilayer circuit board by depositing conducting material for the conducting layers 102, 104, 106, 108, and 110 on the insulating layers 114, 116, 118, 120 and 122 individually, and then etching the material away to form the predetermined patterns of the conducting layers 102, 104, 106, 108 and 110. These layers could then be bonded together. The outer conducting layer 112 could be formed upon a separate insulating layer which could be bonded to, and become part of, the insulating layer 122.

Figure 2:
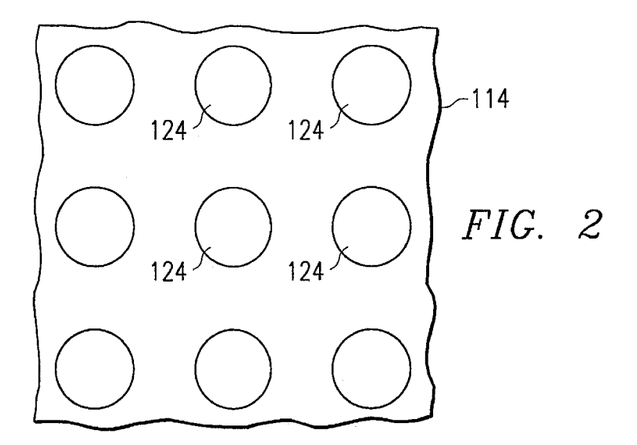
FIG. 2 is a top plan view of a single insulating layer of the insulating layers shown in FIG. 1.

Referring next to FIG. 2, there is shown a top plan view of a single insulating layer 14 shown in FIG. 1. FIG. 2 shows the holes 124 through the insulating layer 14. The holes 124 comprise approximately 50 percent of the surface area of the insulating layer 14 and are formed by a process such as drilling, or using a punch to remove material from the insulating layers 14.

Figure 3A:
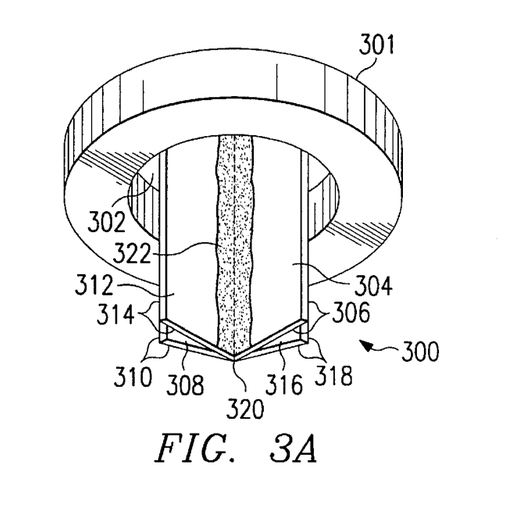
FIGS. 3A and 3B are lower right perspective view and a bottom plan view, respectively, of a connection tower formed according to an embodiment of the present invention.
Figure 3B:
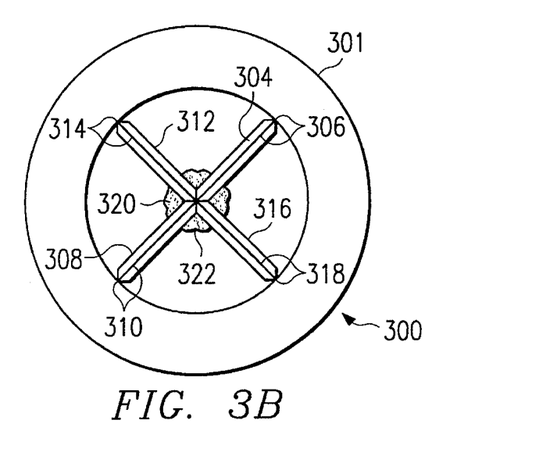

Referring now to FIGS. 3A and 3B, there are shown a bottom right perspective and a bottom plan view, respectively, of a connection tower 300, generally designated by reference numeral 300, formed according to the teachings of the present invention. The connection tower 300 in FIGS. 3A and 3B is used to electrically interconnect the various conducting layers of the multilayer printed circuit board shown in FIG. 1. The connection tower comprises a cylindrical cap 301 of Al, in which a cylindrical recess 302 of a diameter smaller than the diameter of cap 301 is formed. A cross-like structure formed of aluminum fins 304 and 308, and copper fins 312 and 316 substantially perpendicular to one another, projects from within the recess 302 of the cap 301. It should be recognized that the fins 304, 308, 312, and 316 can be any other conducting material such as, for example, iron, zinc or magnesium.

Figure 4:
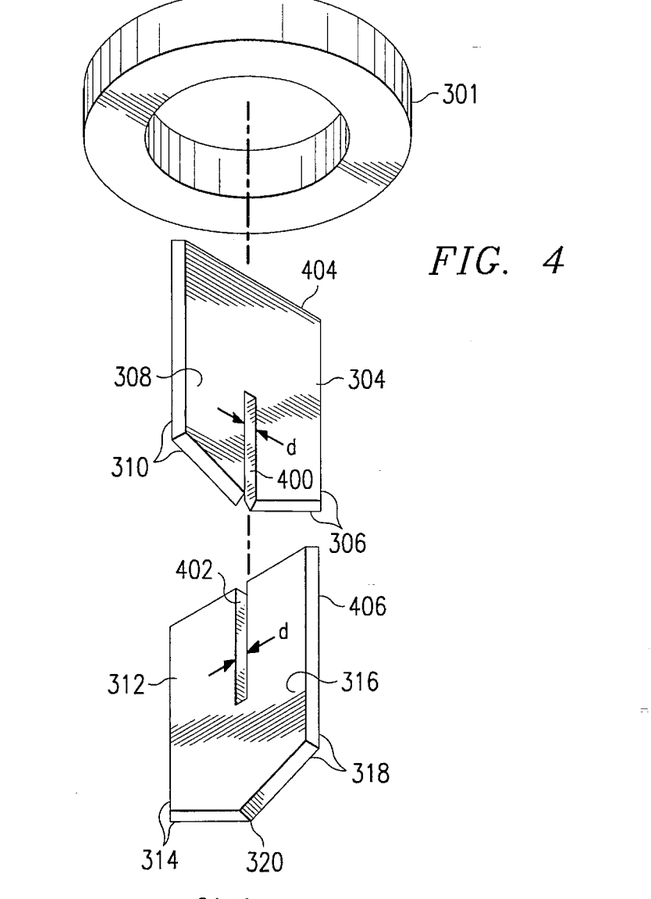
FIG. 4 is an exploded lower right perspective view of the Al and Cu plate which comprise the connection tower of FIGS. 3A and 3B.

FIG. 4 illustrates how the crosslike structure may be formed from a plate 404 and a plate 406. The plate 404 is beveled on the outer and bottom edges to form sharp edges 306, 310, and plate 406 is beveled on the outer and bottom edges to form sharp edges 314, 318. The plates 404 and 406 are angled to a point centered on their bottom edges. A first slot 400 is cut in plate 404. The slot 400 is of a width substantially equal to the thickness of plate 406. The slot 400 extends halfway up from the point of maximum height of plate 404 and is centered along the length of plate 404. A second slot 402 is cut in plate 406. The slot 402 is of a width substantially equal to the thickness of plate 404. The slot 402 extends halfway down to the point of maximum height of plate 406 and is centered along the length of plate 406. The plate 404 and plate 406 are turned lengthwise at right angles to one another, and plate 404 is placed down upon plate 406 so that the two slots slide into one another, forming the crosslike structure of Al fins 304 and 308, and Cu fins 312 and 316. Slots 400 and 402 are dimensioned so that the plates 404 and 406 fit tightly and hold together without external pressure or reinforcement. As an alternative, the plates may be welded or held together by brackets. A point 320 is formed at the bottom edge where the fins make a sharp tip capable of penetrating when pushed into the cavity.

The connection of plate 404 and plate 406 is done after purifying the plates in acid in a nitrogen atmosphere. The contact is sealed by applying a glass like or acrylic substance, such as Acaldit two-component glue, onto the contact area in the nitrogen atmosphere to form a hermetic seal 322 over the contact area coveting the intersection between the plate 404 and plate 406.

Use of the connection tower 300 provides a noncorrosive, low resistance contact when an outer conducting layer 102 or 112, is connected to an Al inner conducting layer 102, 104, 106, 108, or 110. The connection tower provides an Al—Al contact to the Al inner conducting layer and a Cu—Cu contact to the CU outer layer. The hermetic seal 322 provides a low resistance noncorrosive path between the Cu and Al. The method of connection using the connection tower 300 is illustrated in FIG. 5, and FIGS. 6A and 6B.

Figure 5:
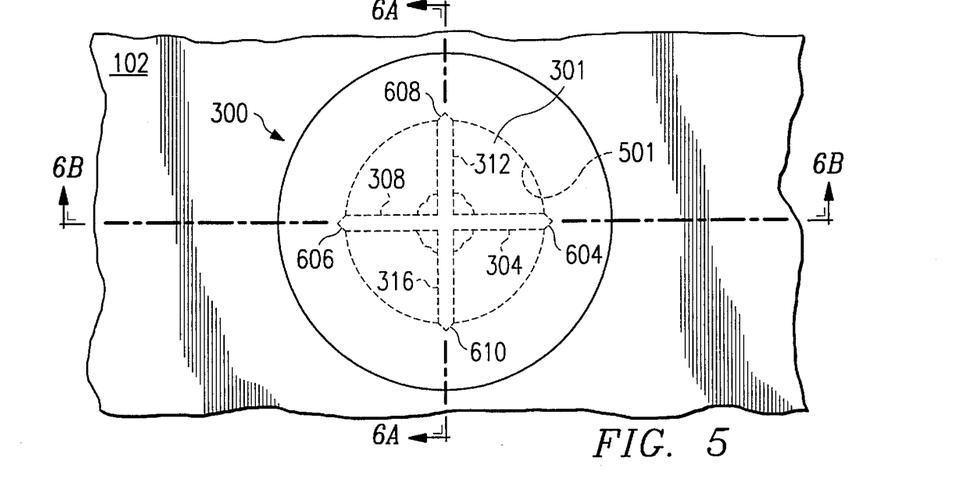
FIG. 5 is a top plan view of the connection tower in FIGS. 3A and 3B mounted in the multilayer circuit printed circuit board of FIG. 1.

FIG. 5 is a top plan view of the connection tower of FIGS. 3A and 3B mounted in the multilayer printed circuit board of FIG. 1 and of the area surrounding the connection tower. The connection tower is inserted down into the hole shown by broken line 501 until the cap 301 is flush with the surface of the outer conducting layer 102. The diameter of the hole shown by broken line 501 is slightly smaller than the diameter of the recess 302 formed in the cap 301. The Al fins 304 mid 308 and Cu fins 312 and 316 are shown by broken lines.

Figure 6A:
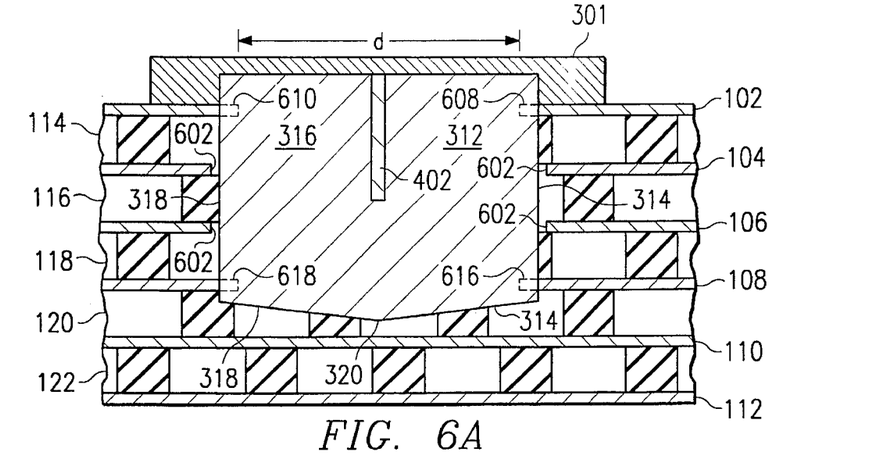
FIGS. 6A and 6B are cross sectional views taken along line 6A—6A and line 6B—6B, respectively, of FIG. 5.
Figure 6B:
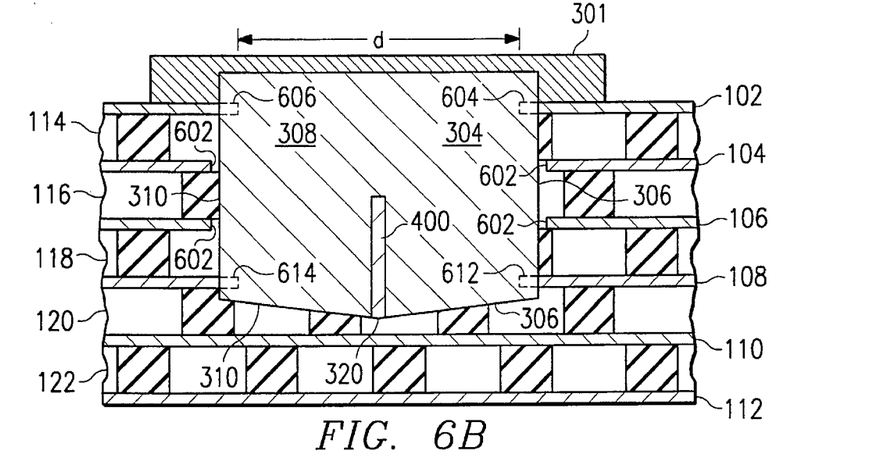

FIGS. 6A and 6B are sectional views taken along lines 6A—6A and 6B—6B, respectively, of FIG. 5. FIGS. 6A and 6B illustrate an electrical connection between Cu outer conducting layer 102 and Al inner conducting layer 108. FIG. 6A is a sectional view taken along lines 6A—6A which run down through the middle of the length of the Cu plate which comprises Cu fins 312 and 316 of FIGS. 3A and 3B. FIG. 6B is a sectional view taken along lines 6B—6B which run down through the middle of the length of Al fins 304 and 308 of FIGS. 3A and 3B.

Hole 501 of diameter d is drilled through the conducting layers 102, 104, 106, and 108, and through insulating layers 114, 116, and 118, halfway into insulating layer 120. When the connection tower 300 is inserted into the hole 501 sharp edges 306, 310, 314, and 318 make direct contact with the Cu outer conducting layer 102 at contact points 604, 606, 608, and 610, respectively. The hole 501 is drilled to a depth so that the vertical portions of sharp edges 306, 310, 314, and 318 also make full contact along the full height of Al inner conducting layer 108 at contact points 612, 614, 616, and 618, respectively. The point 320 of the connection tower 300 does not make contact with Al inner conducting layer 110. Material is removed from the Al inner conducting layers 104 and 106 around the edge of the hole 401 so that gaps 602 are created and no connection is made between the Al inner conducting layers 104 or 106 and Al fin 306, Al fm 310, Cu fin 312 or Cu fin 316. This material can be removed by creating an internal, beneath outer layer 102 hole, centered on the points where hole 501 is to be drilled, of a larger diameter than the diameter of hole 501, during the fabrication of the printed circuit patterns on the conducting layers.

The connection illustrated in FIGS. 6A and 6B, provides Al—Al contacts to the Al inner conducting layer 108 at contact points 612 and 614, and Cu—Cu contacts to the Cu outer conducting layer 102 at contact points 608 and 610. The hole 501 is of a diameter sufficiently smaller than the length of the plates 404 and 406 so that the edges, 306, 310, 314, and 318, press hard into the layers 102 and 108 and form good electrical contacts. Also, the diameter of hole 501 is large enough in relation to the diameter of holes 124 in the insulating layers 114, 116, 118, 120 and 122, so that the conducting layers 102 and 108 maintain rigidity at the contact points 608, 610, 612, and 614. Al-Cu contacts to the Al inner conducting layer 108 at contact points 616 and 618, and Al-Cu contacts to the Cu out conducting layer 102 at contact points 604 and 606 are also formed. Current flow through these Al-Cu contacts will eventually cause corrosion to form at the contact points 604, 606, 616, and 618. This corrosion will create a higher resistance to current flow than is presented by the Al—Al contacts at contact points 612 and 64, and the Cu—Cu contacts at contact points 608 and 610. As the resistance of the perpendicular bi-metallic Al-Cu contacts increase with increased corrosion, current will cease flowing through these Al-Cu contacts. Rather, current will flow between the low resistance Al—Al and Cu—Cu contacts inside the printed circuit board.

Figure 7:
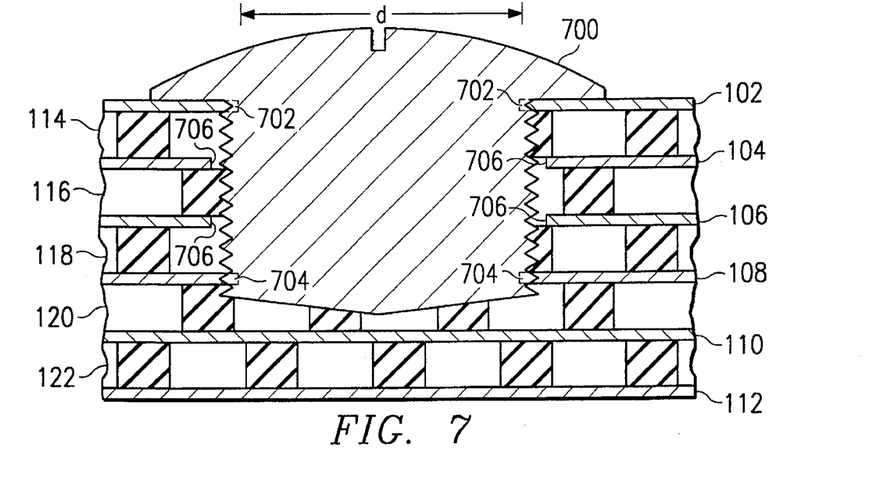
FIG. 7 is a cross sectional view of an alternative embodiment of the invention.

An alternative embodiment of the present invention comprises the multilayer printed circuit board 100 of FIG. 1 and a zinc plated screw used in place of the connection tower to form connections between the conducting layers. FIG. 7 is a cross sectional view of this alternative embodiment of the invention. The cross sectional view is taken along the vertical plane which bisects the screw 700. The zinc plated screw 700 would be inserted in hole 501 of FIG. 5 in the same manner as the connection tower 300. The use of the zinc plated screw would provides a Cu-zinc contact area 702 around the screw 700 at the Cu outer layer 102, and an Al-zinc contact area 704 around the screw 700 at the Al inner layer 108. The diameter of the screw 700 would be of a size which would allow the body of screw 700 to press sufficiently hard into conducting layers 102 and 108 to form an effective electrical contact at the contact areas 702 and 704. Material would be removed from the other conducting layers 104 and 106 to create gaps 706 around the screw 700 large enough to prevent electrical contact between screw 700 and these other layers 104 and 106. The electrochemical potential of zinc is –0.76 v., which is approximately midway between the electrochemical potentials of –1.66 v., for Cu, and 0.34 v., for Al. The Cu-zinc contact points have an electrochemical potential difference of 0.9 v. The Al-zinc contact points have an electrochemical potential difference of 1.1 v. These differences are effectively half the electrochemical potential difference of an Al-Cu contact. This provides a less corrosive contact than an Al-Cu contact would.

The weight savings realized by the implementation of the invention in a double sided circuit board with a one sided surface area of 561 $cm^2$ can be calculated. The specific gravity of Al, Cu and FR4 are 2.7, 8.9 and 2.1 $g/cm^3$ respectively. The two Cu outer conducting layers weight $2 \times (561 \text{ cm}^2 \times 0.0025 \text{ cm} \times (8.9 \text{ g/cm}^3))$ or 24.96 g. The five FR4 layers with 50% of material removed weight $5 \times (280.5 \text{ cm}^2 \times 0.010 \text{ cm} \times (2.100 \text{ g/cm}^3))$ or 29.452 g. The four Al inner conducting layers weigh $4 \times (561 \text{ cm}^2 \times 0.0025 \text{ cm} \times 2.7 \text{ g/cm}^3)$ or 15.147 g. Ignoring the weight of the connection towers, the weight of the multilayer printed circuit is then 69.565 g. This is 64.234 g (2.307 ounces) or 48% less than a multilayer printed circuit board of the same type in which only Cu is used for the conducting layers.

Based upon the foregoing, those skilled in the art should now fully understand and appreciate the considerable advantages and novel features of the present invention. By using multiple types of conductive material; "webbed," "netted," or otherwise reduced weight insultative layers; and/or the specially designed layer connective structures taught herein, a substantially reduced weight printed circuit board can be manufactured. A typical printed circuit board manufactured according to the teachings herein could be about 64.2 grams or 48% lighter than traditional boards. This weight reduction could immediately be passed onto and enjoyed by devices, such as PDA's, in which the reduced weight printed circuit board could be employed.

It is believed that the operation and construction of the present invention will be apparent from the foregoing description and, while the invention shown and described herein has been characterized as particular embodiments, obvious changes and modifications may be made therein without departing from the spirit and scope of the invention as defined in the following claims.

What is claimed is:

1. A low weight multilayer printed circuit board comprising:
    a first conducting layer comprising a first material;
    a second conducting layer comprising a second material;
    an insulating layer bonded to said conducting layers and disposed to separate said conducting layers from one another; and
    a structure interconnecting said first and said second conducting layers, said structure having a first contact point formed of said first material and a second contact point formed of said second material, said structure forming an electrical connection between said first and said second conducting layers such that said first contact point contacts said first layer and said second contact point contacts said second layer.

2. The multilayer printed circuit board of claim 1 wherein said first material comprises a material selected from the group consisting of Cu, Al, iron, zinc, and magnesium.

3. The multilayer printed circuit board of claim 2 wherein said second material comprises a material selected from the group consisting of Cu, Al, iron, zinc and magnesium.

4. The multilayer printed circuit board of claim 1, wherein said insulating layer comprises a material having at least one void.

5. The multilayer printed circuit board of claim 1, wherein said first conducting layer is a conducting layer on an outer surface of said multilayer printed circuit board, and, further, wherein said second conducting layer is an internal conducting layer of said multilayer circuit board.

6. The multilayer printed circuit board of claim 5 wherein said first material comprises a material selected from the group consisting of Cu, Al, iron, zinc, and magnesium.

7. The multilayer printed circuit board at claim 5 wherein said second material comprises a material selected from the group consisting of Cu, Al, iron, zinc, and magnesium.

8. The multilayer printed circuit board of claim 1, wherein said structure comprises:
    a first fin;
    a second fin; and
    means for forming an electrical connection between said first fin and said second fin.

9. The multilayer printed circuit board of claim 8 wherein said means for forming an electrical connection between said first and second fin comprises a hermetic seal.

10. The multilayer printed circuit board of claim 8 wherein said first fin includes said first contact point, and, further, wherein said second fin includes said second contact point.

11. The multilayer printed circuit board of claim 1 in which said first material comprises Cu and said second material comprises Al.

12. A low weight multilayer printed circuit board comprising:
    a first conducting layer comprising a first material;
    a second conducting layer comprising a second material;
    an insulating layer bonded to at least one of said first and second conducting layers and disposed to separate said first and second conducting layers from one another; and
    a structure interconnecting said first and second conducting layers, said structure having a first contact point formed of a third material, said structure further having a second contact point formed of said third material, said structure forming an electrical contact between said first and second conducting layers.

13. The multilayer printed circuit board of claim 12 wherein said first material comprises a material selected from the group consisting of Cu, Al, zinc, iron, and magnesium.

14. The multilayer printed circuit board of claim 13 wherein said second material comprises a material selected from a group consisting of Cu, Al, zinc, iron, and magnesium.

15. The multilayer printed circuit board of claim 12 wherein said first, second, and third materials each have electrochemical potential values, and wherein said third material comprises a material with an electrochemical potential value between the electrochemical potential values of said first and second materials.

16. The multilayer printed circuit board of claim 12 wherein said first material comprises Cu, said second material comprises Al, and said third material comprises zinc.

17. The multilayer printed circuit board of claim 12, wherein said insulating layer comprises a material having at least one void.

18. The multilayer printed circuit board of claim 17, wherein said insulating layer comprises a perforated material.

19. The multilayer printed circuit board of claim 12, wherein said first conducting layer is on an outer surface of said multilayer printed circuit board, and, further, wherein said second conducting layer is an internal conducting layer of said multilayer circuit board.

20. The multilayer printed circuit board of claim 19 wherein said first material comprises a material selected from the group consisting of Cu, Al, iron, zinc, and magnesium.

21. The multilayer printed circuit board of claim 20 wherein said second material comprises a material selected from the group consisting of Cu, Al, iron, zinc, and magnesium.

22. The multilayer printed circuit board of claim 12, wherein said structure interconnecting said first and second conducting layers comprises a screw plated with said third material.

23. The multilayer printed circuit board of claim 12 wherein said screw is hollow.

24. In a low weight multilayer printed circuit board including at least one conducting layer comprising a first material and at least one conducting layer comprising a second material, an apparatus for forming an electrical connection between a plurality of said conducting layers, said apparatus comprising:

a first contact point comprising said first material;

a second contact point comprising said second material; and means for electrically interconnecting said first contact point and said second contact point.

25. The apparatus of claim 24 wherein said means for electrically interconnecting comprises a hermetic seal formed between said first material and said second material.

26. A connector for use with a multi-layer circuit board having at least two electrically conductive laminae formed of different first and second conductive materials and separated by an insulating laminae, and further having a bore extending generally perpendicularly therethrough, said connector comprising:

a first metal plate formed of the first conductive material and being substantially rectangular having a length extending between the two conductive laminae and sufficiently wide to provide an electrical connection with each conductive laminae at both ends;

a second metal plate formed of the second conductive material and being substantially rectangular in shape having a length extending between the conductive laminae and sufficiently wide to provide an electrical connection with each conductive laminae at both ends, and intersecting with said first metal plate to form a bi-metallic electrical connection; and a seal covering the bi-metallic connection to prevent exposure to the atmosphere, whereby the connector provides for flow of current between the conductive laminae through the bi-metallic connection.

27. The connector of claim 26 in which said first material comprises a material selected from the group consisting of Cu, Al, iron, zinc, and magnesium.

28. The connector of claim 27 in which said second material comprises a material selected from the group consisting of Cu, Al, iron, Zinc, and magnesium.

29. The connector of claim 28 further comprising a cap with a recess therein, said first metal plate and said second metal plate being inserted into said recess to form said connector.

30. A connector for use with a multi-layer circuit board having at least two electrically conductive laminae formed of different first and second conductive materials having different electrochemical potentials and separated by an insulating laminae, and further having a bore extending generally perpendicularly therethrough, said connector comprising:

a metal pin formed of a conductive material having an electrochemical potential between that of the first and second conductive materials and having a length extending between the conductive laminae to provide an electrical connection with each conductive laminae at both ends of said pin.

31. The connector of claim 30 in which said first, conductive material comprises a material selected from the group consisting of Cu, Al, iron, zinc, and magnesium.

32. The connector of claim 31 in which said second conductive material comprises a material selected from the group consisting of Cu, Al, iron, zinc, and magnesium.

33. The connector of claim 32 in which said third conductive material comprises a material selected from the group consisting of Cu, Al, iron, zinc, and magnesium.

34. A multilayer printed circuit board comprising:

a first conducting layer comprising a first material;

a second conducting layer comprising a second material;

an insulating layer bonded to at least one of said first and second conducting layers and disposed to separate said first and second conducting layers from one another; and at least one structure interconnecting said first and second conducting layers, said structure comprising a first fin having a first contact point formed of said first material, said structure further comprising a second fin having a second contact point formed of said second material, said first and second fins having means for forming an electrical connection between said first fin and said second fin, said structure forming an electrical contact between said first and second conducting layers such that said first layer contacts said first contact point and said second layer contacts said second contact point.

35. The multilayer printed circuit board of claim 34, wherein said means for forming an electrical connection between said first and second fin comprises a hermetic seal.

36. In a multilayer printed circuit board including at least a first conducting layer comprising a first material and at least a second conducting layer comprising a second material, an apparatus for forming an electrical connection between a plurality of said first and second conducting layers, said apparatus comprising:

a first contact point comprising said first material;

a second contact point comprising said second material; and means for electrically interconnecting said first contact point and said second contact point.

37. The apparatus of claim 36, wherein said electrically interconnecting means establishes a hermetic seal between said first conducting layer and said second conducting layer.

38. The multilayer printed circuit board of claim 1, wherein there are at least one additional conducting layer between said first conducting layer and said second conducting layer.

39. The multilayer printed circuit board of claim 12, further comprising at least a third conducting layer between said first conducting layer and said second conducting layer.

40. The multilayer printed circuit board of claim 34, further comprising at least a third conducting layer between said first conducting layer and said second conducting layer.

* * * * *

UNITED STATES PATENT AND TRADEMARK OFFICE
CERTIFICATE OF CORRECTION

PATENT NO. : 5,619,018  
DATED : Apr. 8, 1997  
INVENTOR(S) : Rossi

Page 1 of 2

It is certified that error appears in the above-indentified patent and that said Letters Patent is hereby corrected as shown below:

Title Page, Item [56],  
Attorney, Agent  
or Firm                  Replace "Markku Rossi"  
                                        With --Jenkens & Gilchrist, A Professional Corporation--

Column 2, line 22        Replace "cmx"  
                                          With --cm x--

Column 4, line 16        Replace "performed"  
                                          With --perforated--

Column 5, line 9          Replace "fight"  
                                          With --right--

Column 5, line 24        Replace "coveting"  
                                          With --covering--

Column 5, line 31        Replace "CU"  
                                          With --Cu--

Column 5, line 43        Replace "mid"  
                                          With --and--

UNITED STATES PATENT AND TRADEMARK OFFICE
CERTIFICATE OF CORRECTION

PATENT NO. : 5,619,018  
DATED : Apr. 8, 1997  
INVENTOR(S) : Rossi

It is certified that error appears in the above-indentified patent and that said Letters Patent is hereby corrected as shown below:

Column 6, line 4     Replace "fm"  
                         With --fin--

Signed and Sealed this

Ninth Day of September, 1997

Attest:

BRUCE LEHMAN

*Attesting Officer*     *Commissioner of Patents and Trademarks*